(12) United States Patent
Shibayama

(10) Patent No.: US 6,346,837 B1
(45) Date of Patent: Feb. 12, 2002

(54) DIGITAL DELAY-LOCKED LOOP CIRCUIT HAVING TWO KINDS OF VARIABLE DELAY CIRCUITS

(75) Inventor: Atsufumi Shibayama, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 09/146,533

(22) Filed: Sep. 3, 1998

(30) Foreign Application Priority Data

Sep. 3, 1997 (JP) .............................................. 9-237573

(51) Int. Cl.⁷ ................................................. H03L 7/06
(52) U.S. Cl. ........................................ 327/156; 327/160
(58) Field of Search .................................. 327/149, 150, 327/147, 156, 158, 159, 153, 161, 151, 160, 269, 270, 271, 276, 277, 278, 279

(56) References Cited

U.S. PATENT DOCUMENTS

| | | | | |
|---|---|---|---|---|
| 5,184,027 A | * | 2/1993 | Masuda et al. | 307/269 |
| 5,488,641 A | * | 1/1996 | Ozkan | 375/374 |
| 5,712,582 A | * | 1/1998 | Yokota et al. | 327/156 |
| 5,963,069 A | * | 10/1999 | Jefferson et al. | 327/158 |
| 5,994,933 A | * | 11/1999 | Yamanada et al. | 327/158 |

FOREIGN PATENT DOCUMENTS

| | | | |
|---|---|---|---|
| JP | 61-73422 | 4/1986 | H03L/7/00 |
| JP | 63-226110 | 9/1988 | H03K/5/13 |
| JP | 64-72641 | 3/1989 | H04L/7/00 |
| JP | 3-21119 | 1/1991 | H03L/7/08 |
| JP | 5-41232 | 6/1993 | H03L/7/06 |
| JP | 6-77819 | 3/1994 | H03H/17/02 |
| JP | 6-112814 | 4/1994 | H03L/7/08 |
| JP | 8-148995 | 6/1996 | H03L/7/08 |
| JP | 8-237091 | 9/1996 | H03K/5/135 |
| JP | 9-74352 | 3/1997 | H03L/7/06 |
| JP | 9-83358 | 3/1997 | H03K/5/135 |
| JP | 9-321614 | 12/1997 | H03L/7/00 |
| JP | 10-171548 | 6/1998 | H04L/7/02 |

* cited by examiner

Primary Examiner—Toan Tran
Assistant Examiner—Linh Nguyen
(74) Attorney, Agent, or Firm—Sughrue, Mion, Zinn, Macpeak & Seas, PLLC

(57) ABSTRACT

In a digital delay-locked loop circuit, a variable delay circuit for delaying an input signal and generating an output signal includes a first variable delay circuit for delaying the input signal with a first delay time changed at first intervals and a second variable delay circuit for delaying the input signal with a second delay time changed at second intervals smaller than the first intervals. A phase comparator compares the phase of a feedback signal derived from the output signal with the phase of said reference signal. A counter circuit controls the first and second delay times in accordance with a difference in phase between the feedback signal and the reference signal so that the difference in phase is brought close to zero.

22 Claims, 15 Drawing Sheets

Fig. 3    PRIOR ART

| STATE | OUTPUT | | | | | |
|---|---|---|---|---|---|---|
| | 0 | 1 | 0 | ... | n−2 | n−1 |
| "0" | 1 | 0 | 0 | ... | 0 | 0 |
| "1" | 0 | 1 | 0 | ... | 0 | 0 |
| "2" | 0 | 0 | 1 | ... | 0 | 0 |
| ⋮ | | | | | | |
| "n−2" | 0 | 0 | 0 | ... | 1 | 0 |
| "n−1" | 0 | 0 | 0 | ... | 0 | 1 |

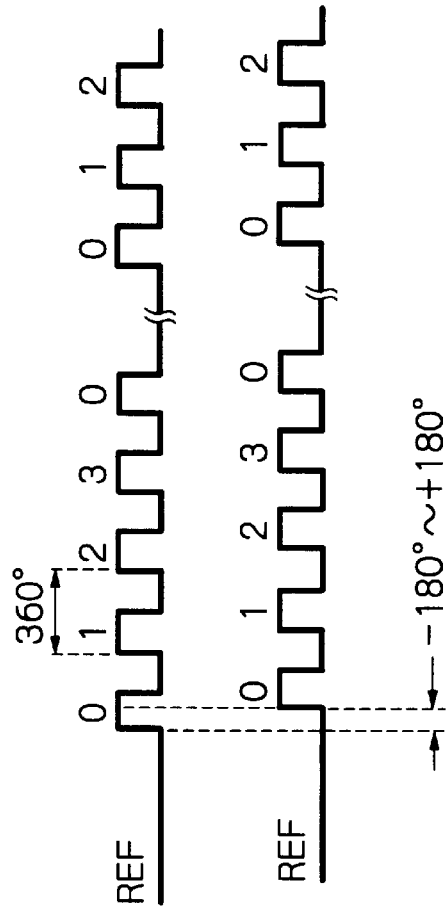
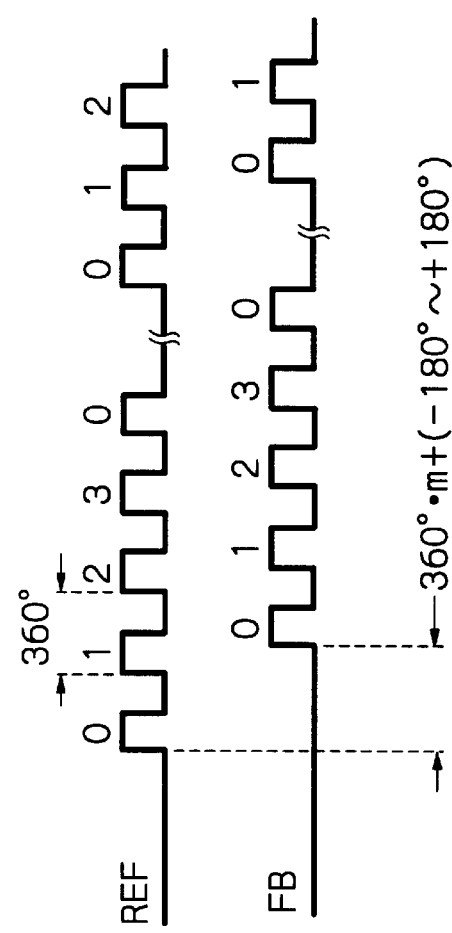
Fig. 4A
Fig. 4B
Fig. 5A
Fig. 5B

Fig. 7A

| STATE | OUTPUT | | | | | |
|---|---|---|---|---|---|---|
| | C0 | C1 | C0 | ... | C5 | C6 |
| "0" | 0 | 0 | 0 | ... | 0 | 0 |
| "1" | 1 | 0 | 0 | ... | 0 | 0 |
| "2" | 1 | 1 | 0 | ... | 0 | 0 |
| ⋮ | | | | | | |
| "6" | 1 | 1 | 1 | ... | 1 | 0 |
| "7" | 1 | 1 | 1 | ... | 1 | 1 |

Fig. 7B

| STATE | OUTPUT | | |
|---|---|---|---|
| | F0 | F1 | F2 |
| "0" | 0 | 0 | 0 |
| "1" | 1 | 0 | 0 |
| "2" | 0 | 1 | 0 |
| "3" | 0 | 0 | 1 |

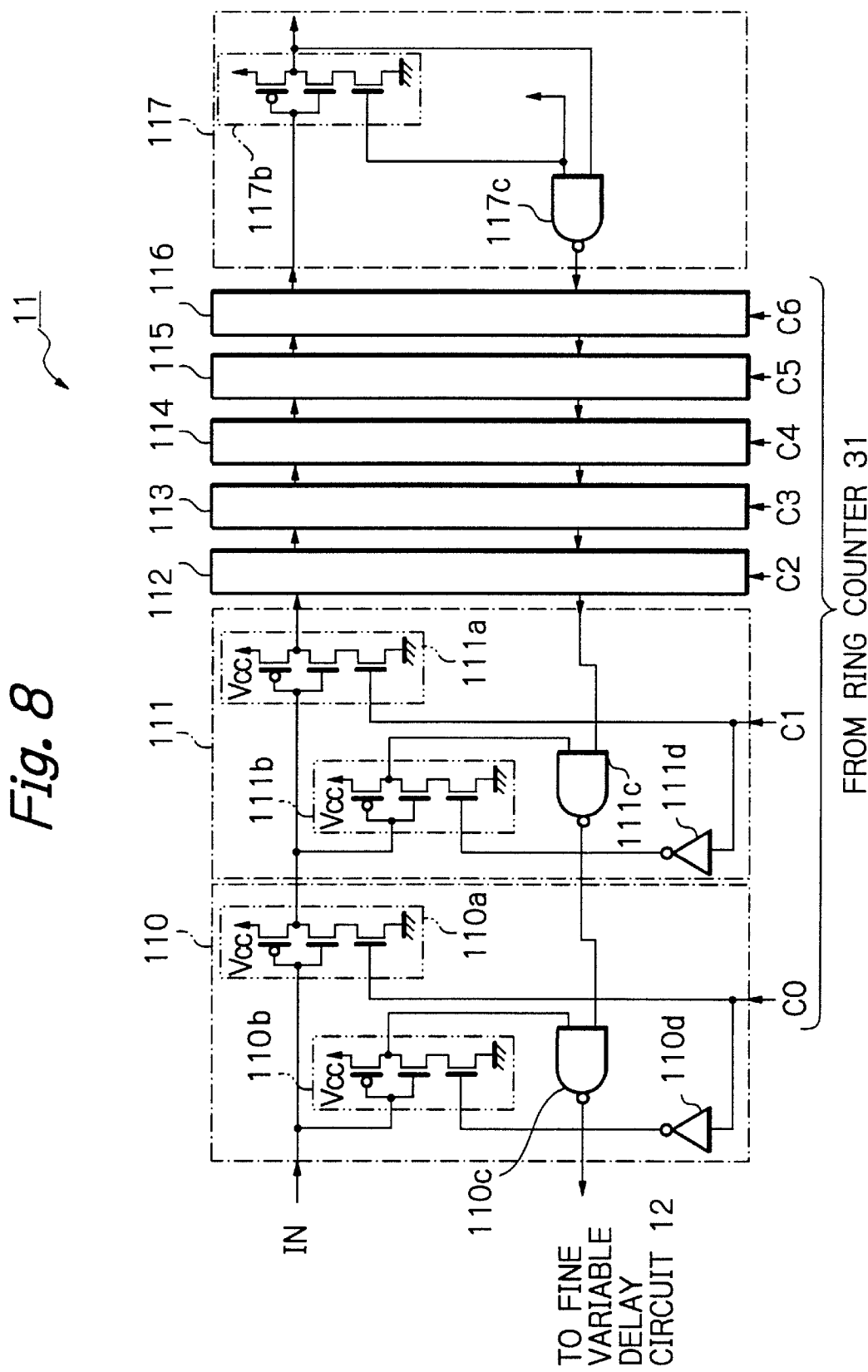

DIGITAL DELAY-LOCKED LOOP CIRCUIT HAVING TWO KINDS OF VARIABLE DELAY CIRCUITS

BACKGROUND OF THE INVENTION

1. Field of the Invention

The present invention relates to a digital delay-locked loop (DLL) circuit.

2. Description of the Related Art

A prior art digital DDL circuit is constructed by a variable delay circuit formed by an inverter chain for delaying an input signal to generate an output signal, a phase comparator for comparing the phase of a feedback signal with the phase of a reference signal, and a ring counter for adjusting the delay time of the delay circuit. Thus, the delay time of the delay circuit is controlled in accordance with the output of the phase comparator, so that the difference in phase between the feedback signal and the reference signal is brought close to zero. This will be explained later in detail.

In the above-described prior art digital DDL circuit however, since the accuracy of the delay time of the variable delay circuit is determined by the value defined by two inverters of the inverter chain, it is impossible to carry out a more fine delay time control, which increases jitter in the output signal.

Also, if the accuracy of the delay time of the variable delay circuit is improved by dereasing the delay time of each inverter, it will take a longer locking time.

Therefore, in the prior art digital DDL circuit, the decrease of jitter has a trade-off relationship to the decrease of the locking time.

Further, in order to enlarge the range of the delay time of the variable delay circuit, if the inverter chain is lengthened, a selector for selecting the inverter chain is also increased in size, which increases the delay time of the selector. As a result, the minimum delay time of the variable delay circuit is increased. Further, the longer inverter chain will take a longer locking time.

Additionally, if the difference in phase between the feedback signal and the reference signal is smaller than −180° or larger than +180°, it is impossible to correctly lock the feedback signal to the reference signal.

SUMMARY OF THE INVENTION

It is an object of the present invention to provide a digital DDL circuit capable of decreasing jitter as well as decreasing the locking time.

Another object is to correctly lock a feedback signal to a reference signal even if the difference in phase is large.

According to the present invention, in a digital delay-locked loop circuit, a variable delay circuit for delaying an input signal and generating an output signal includes a first variable delay circuit for delaying the input signal with a first delay time changed at first intervals and a second variable delay circuit for delaying the input signal with a second delay time changed at second intervals smaller than the first intervals. A phase comparator compares the phase of a feedback signal derived from the output signal with the phase of the reference signal. A counter circuit controls the first and second delay times in accordance with a difference in phase between the feedback signal and the reference signal so that the difference in phase is brought close to zero.

BRIEF DESCRIPTION OF THE DRAWINGS

The present invention will be more clearly understood from the description as set forth below, as compared with the prior art, with reference to the accompanying drawings, wherein:

FIG. 3 is a table showing the output of the ring counter of FIG. 1;

FIGS. 4A and 4D are timing diagrams showing examples of the reference signal and the feedback signal of FIG. 1;

FIGS. 5A and 5B are timing diagrams showing other examples of the reference signal and the feedback signal of FIG. 1;

FIGS. 7A and 7B are tables showing the output of the ring counters of FIG. 6;

FIG. 8 is a detailed circuit diagram of the coarse variable delay circuit of FIG. 6;

DESCRIPTION OF THE PREFERRED EMBODIMENT

Before the description of the preferred embodiment, a prior art digital DDL circuit will be explained with reference to FIGS. 1, 2 and 3.

Figure 1:
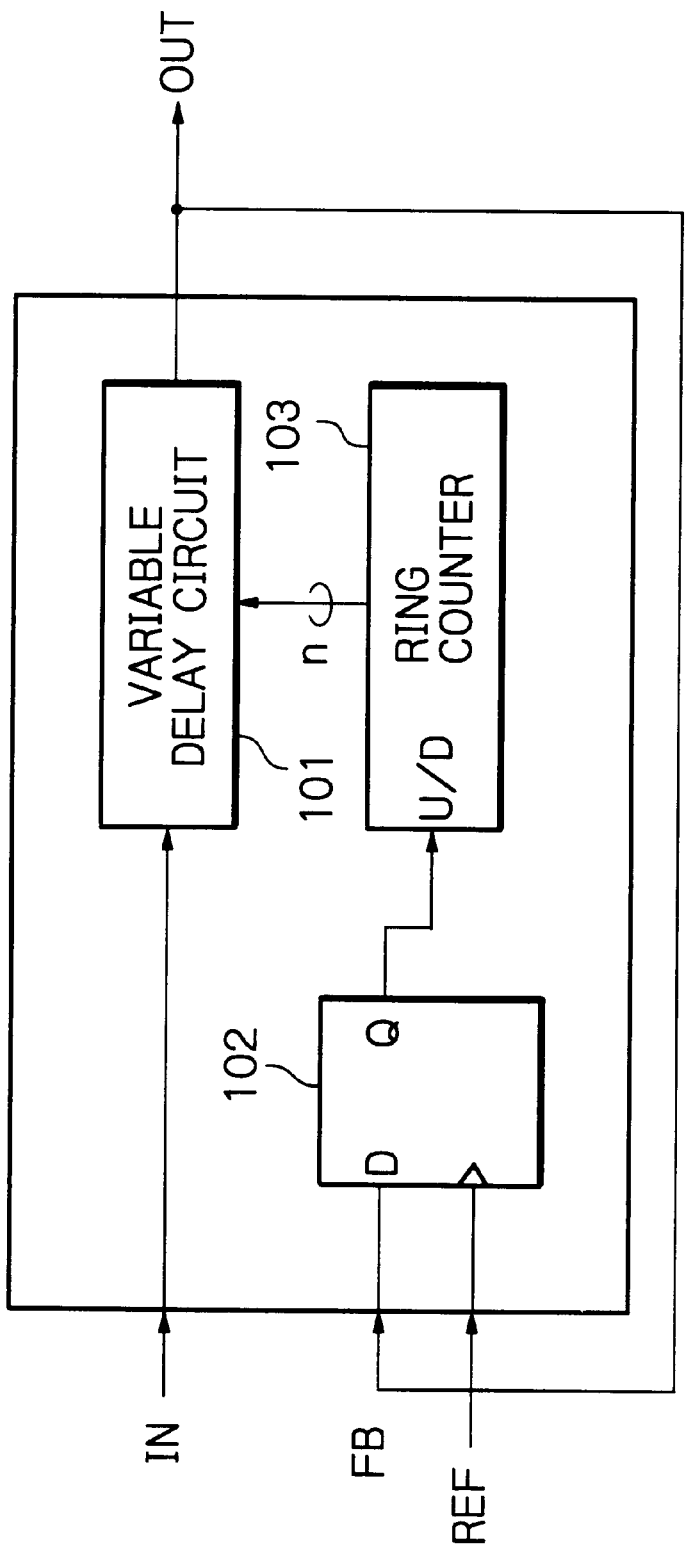
FIG. 1 is a block circuit diagram illustrating a prior art digital DDL circuit.

In FIG. 1, a variable delay circuit 101 delays an input signal IN to generate an output signal OUT. Also, a phase comparator compares the phase of a feedback signal FB which is in this case the output signal OUT with the phase of a reference signal REF. An output of the phase comparator 102 is supplied to a ring counter 103 for adjusting a delay time T of the delay circuit 101. Thus, the delay time T of the delay circuit is controlled in accordance with the output of the phase comparator 102, so that the difference in phase between the feedback signal FB and the reference signal REL is brought close to zero.

Figure 2:
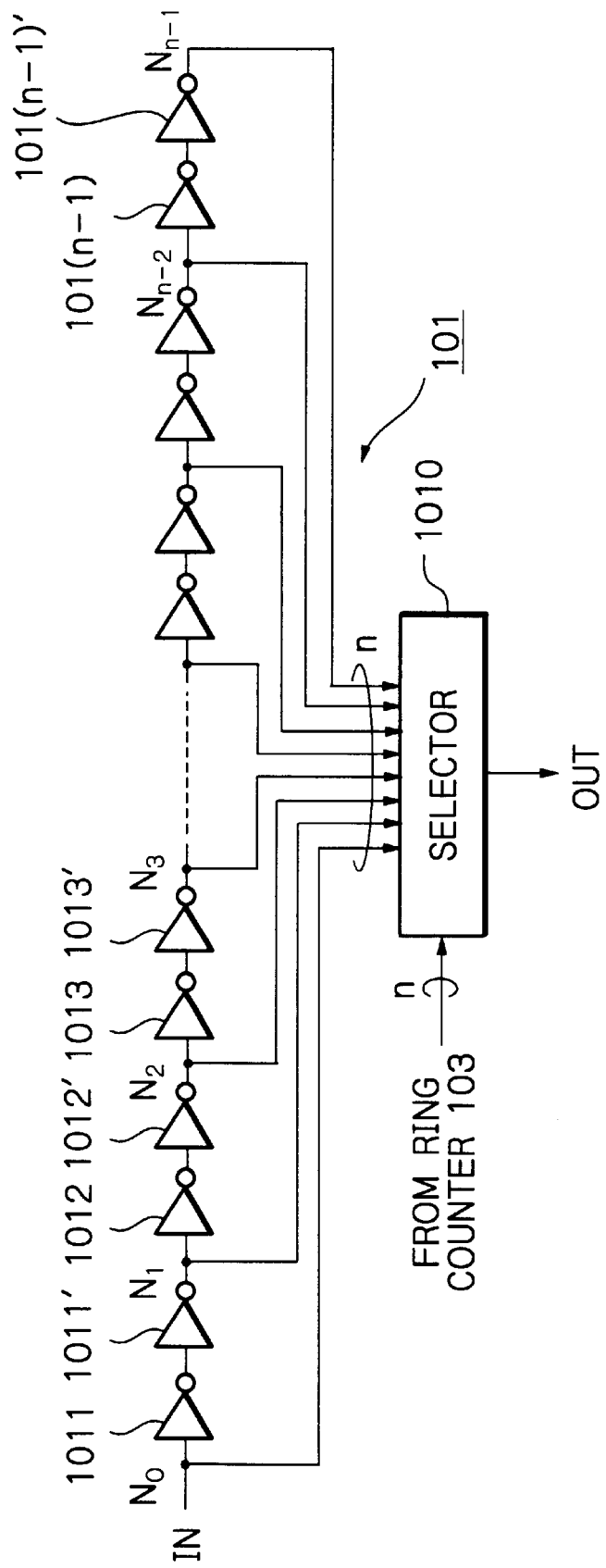
FIG. 2 is a detailed circuit diagram of the delay circuit of FIG. 1.

As illustrated in FIG. 2, the variable delay circuit 101 is constructed by an inverter chain formed by inverters 1011, 1011', 1012, 1012', . . . 101n−1, 101n−1', and a selector 1010. In this case, two of the inverters such as 1011 and 1011' form a delay element having a delay time $T_d$. Therefore, the selector 1010 is operated by the output of the ring counter 103 to select one of nodes $N_0, N_1, \ldots, N_{n-1}$ as an output so that the delay time T of the variable delay circuit 101 is 0, $T_d$, $2T_d$, . . . , or $(n-1)T_d$.

Returning to FIG. 1, the phase comparator 102 is constructed by a D-type flip-flop which has a clock input for receiving the reference signal REF and a data input for receiving the feedback signal FB. As a result, when the phase of the feedback signal FB advances the phase of the reference signal REF, the output Q of the D-type flip-flop becomes "1". On the other hand, when the feedback signal FB retards the phase of the reference signal REP, the output Q of the D-type flip-flop output becomes "0".

The ring counter 103 is an up/down n-ary ring counter with a decoding function. Therefore, when the output Q of the D-type flip-flop is "1", the state of the ring counter 103 is changed from state "0" via state "1", state "2", . . . , to state "n−1" as shown in FIG. 3. On the other hand, when the output Q of the D-type flip-flop is "0", the state of the ring counter 103 is from state "n−1" via state "n−2", state "n−3", . . . , to state "0" as shown in FIG. 3.

In the digital DDL circuit of FIG. 1, since the accuracy of the delay time T of the variable delay circuit 101 is determined by the value $T_d$ defined by two inverters it is impossible to carry out a more fine delay time control than that determined by the value $T_d$, which increases jitter in the output signal OUT.

Also, if the accuracy of the delay time T of the variable delay circuit 101 is improved by dereasing the value $T_d$, it will take a longer locking time.

Therefore, in the digital DDL circuit of FIG. 1, the decrease of jitter has a trade-off relationship to the decrease of the locking time.

Further, in order to enlarge the range of the delay time T of the variable delay circuit 101, if the inverter chain is lengthened, the selector 1010 is also increased in size, which increases the delay time of the selector 1010. As a result, the minimum delay time of the variable delay circuit 101 is increased. Further, the longer inverter chain will take a longer locking time.

Additionally, as shown in FIGS. 4A and 4B, if the difference in phase between the feedback signal FB and the reference signal REP is within a range from −180° to +180°, it is possible to correctly lock the feedback signal FB to the reference signal REF so that the difference in phase therebetween is zero. However, as shown in FIGS. 5A and 5B, if the difference in phase between the feedback signal FB and the reference signal REF is smaller than −180° or larger than +180°, it is impossible to correctly lock the feedback signal FB to the reference signal REF. In this case, the difference in phase therebetween is locked at 360°·m where m is ±1, ±2, . . . .

Figure 6:
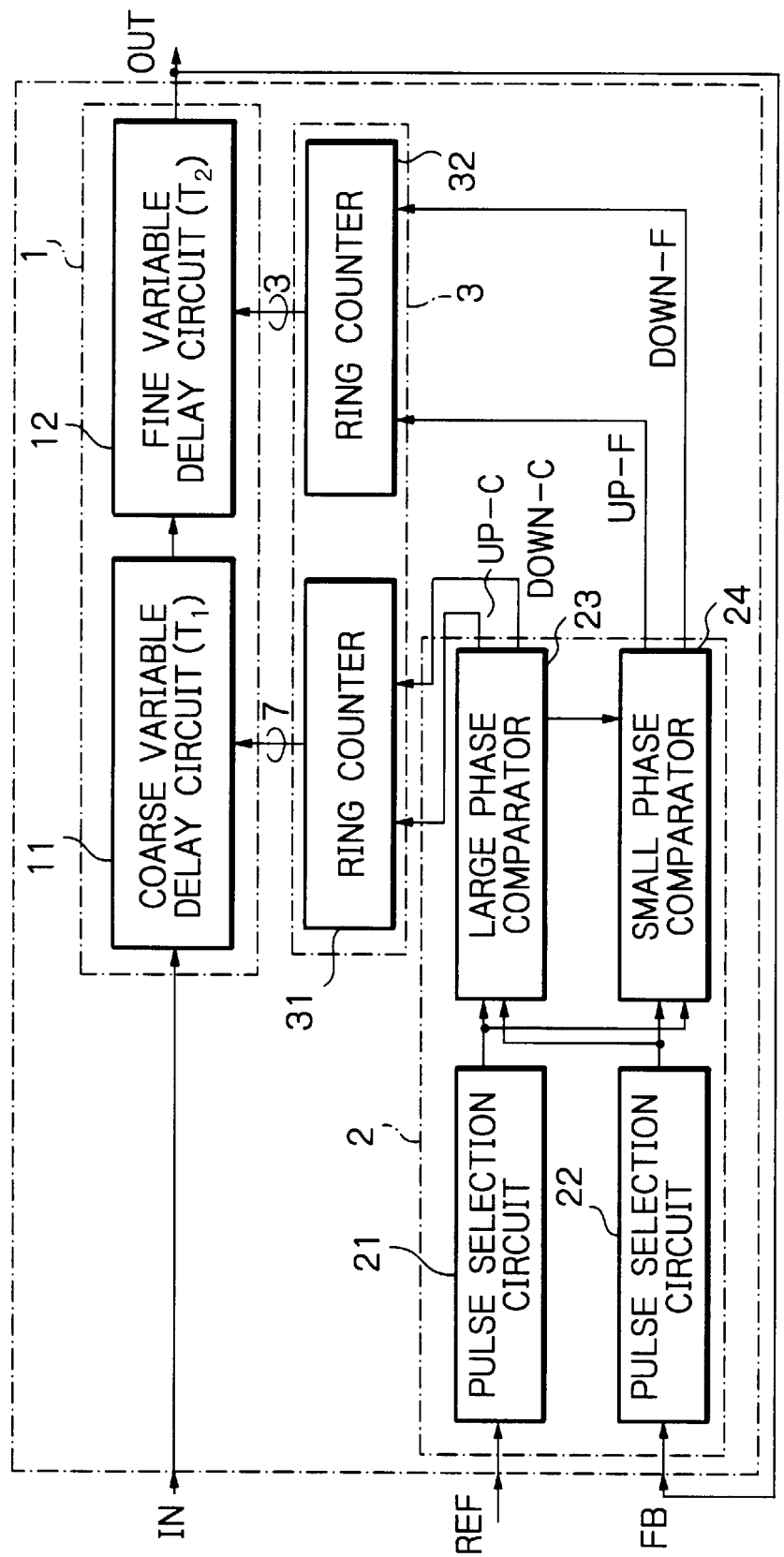
FIG. 6 Is a block circuit diagram illustrating an embodiment of the digital DDL circuit according to the present invention.

In FIG. 6, which illustrates an embodiment of the present invention, a variable delay circuit 1 is constructed by a series of a coarse variable delay circuit 11 and a fine variable delay circuit 12. That is, a delay time T of the variable delay circuit 1 is determined by $$T=T_1+T_2$$

where $T_1$ is a delay time of the coarse variable delay circuit 11, and $T_2$ is a delay time of the fine variable delay circuit 12.

Also, a phase comparator 2 is constructed by a pulse selection circuit 21, a pulse selection circuit 22, a large phase comparator 23 and a small phase comparator 24.

The pulse selection circuit 21 receives the reference signal REF and numbers the pulses therein.

Also, the pulse selection circuit 21 selects the pulses having a special number such as "1" and transmits them to the large phase comparator 23 and the small phase comparator 24.

The pulse selection circuit 22 receives the feedback signal FB and numbers the pulses therein.

Also, the pulse selection circuit 22 selects the pulses having a special number such as "1" and transmits them to the small phase comparator 24. On the other hand, the pulse selection circuit 22 transmits the non-selected pulses to the large phase comparator 23.

The large phase comparator 23 compares the phase of the feedback signal FB with that of the reference signal REF, when the difference in phase therebetween is large. On the other hand, the small phase comparator 24 compares the phase of the feedback signal FB with that of the reference signal REF, when the difference in phase therebetween is small. Note that, when the large phase comparator 23 is operated to generate one of control signals UP-C and DOWN-C, the small phase comparator 24 is disabled to deactivate both control signals UP-F and DOWN-F.

A counter 3 is constructed by a ring counter 31 connected between the large phase comparator 23 and the coarse variable delay circuit 11 and a ring counter 32 connected between the small phase comparator 24 and the fine variable delay circuit 12. Thus, the coarse delay circuit 11 is controlled in accordance with the output of the large phase comparator 23, and the fine delay circuit 12 is controlled in accordance with the output of the small phase comparator 24.

The ring counter 31 Is an up/down 8-ary ring counter without a decoding function. That is, when the control signal UP-C is "1", the state of the ring counter 31 is changed from state "0" via state "1", state "2", . . . to state "7" as shown in FIG. 7A. On the other hand, when the control signal DOWN-C is "1", the state of the ring counter 31 is changed from state "7" via state "6", state "5", . . . to state "0" as shown in FIG. 7A.

The ring counter 32 is an up/down 4-ary ring counter with a decoding function. That is, when the control signal UP-F is "1", the state of the ring counter 32 is changed from state "0" via state, "1" and state "2" to state "4" as shown in FIG. 7B. On the other hand, when the control signal DOWN-F is "1", the state of the ring counter 32 is changed from state "3" via state "2" and state "1" to state "0" as shown in FIG. 7B.

In FIG. 8, which is a detailed circuit diagram of the coarse variable delay circuit 11 of FIG. 6, seven delay elements 110, 111, . . . 117 are connected in series. Each of the delay elements 110, 111, . . . 116 is formed by a dynamic NAND circuit such as 110a for passing an input signal through each of the delay elements 110, 111, . . . 116, a dynamic HAND circuit such as 110b for folding the input signal, a static NAND circuit such as 110c, and an inverter such as 110d. The delay element 117 is formed by only a dynamic NAND circuit 117b and a static NAND circuit 117c for folding the input signal.

The delay circuits 110, 111, . . . , 116 are controlled by output signals C0, C1, . . . C6, respectively, of the ring counter 31. The output signals C0, C1, . . . , C6 are as shown in FIG. 7A.

For example, if the state of the ring counter 31 is state "1", "0", the output signals C0, C1, . . . , C6 are "0", "0", . . . , "0" as shown in FIG. 7A. As a result, the input signal IN is folded by the dynamic NAND circuit 110b and the static NAND circuit 110c within the delay element 110. In this case, if a delay time $T_c$ is defined by one dynamic NAND circuit and one static NAND circuit, the delay time $T_1$ of the coarse variable delay circuit 11 is determined by the dynamic NAND circuit 110b and the static NAND circuit 110c, so that the delay time $T_1$, is $T_c$.

Also, if the state of the ring counter 31 is state "1", the output signals C0, C1, . . . , C6 are "1", "0", . . . , "0" as shown in FIG. 7A. As a result, the input signal IN is folded by the dynamic NAND circuit 111b and the static NAND circuit 111c within the delay element 111. In this case, since the delay time T, of the coarse variable delay circuit 11 is determined by the dynamic NAND circuits 110a and 111b and the static NAND circuits 111a and 110C, the delay time $T_1$ is $2 \cdot T_c$.

Further, if the state of the ring counter 31 is state "7", the output signals C0, C1, . . . , C6 are "1", "1", . . . , "1" as shown in FIG. 7A. As a result, the input signal IN is folded by the dynamic NAND circuit 117b and the static NAND circuit 117c within the delay element 117. In this case, since the delay time $T_1$ of the coarse variable delay circuit 11 is determined by the dynamic NAND circuits 110a, 111a, . . . , 117b and the static NAND circuits 117c, 116c, . . . , 110c the delay time $T_1$ is $8 \cdot T_c$.

Figure 9:
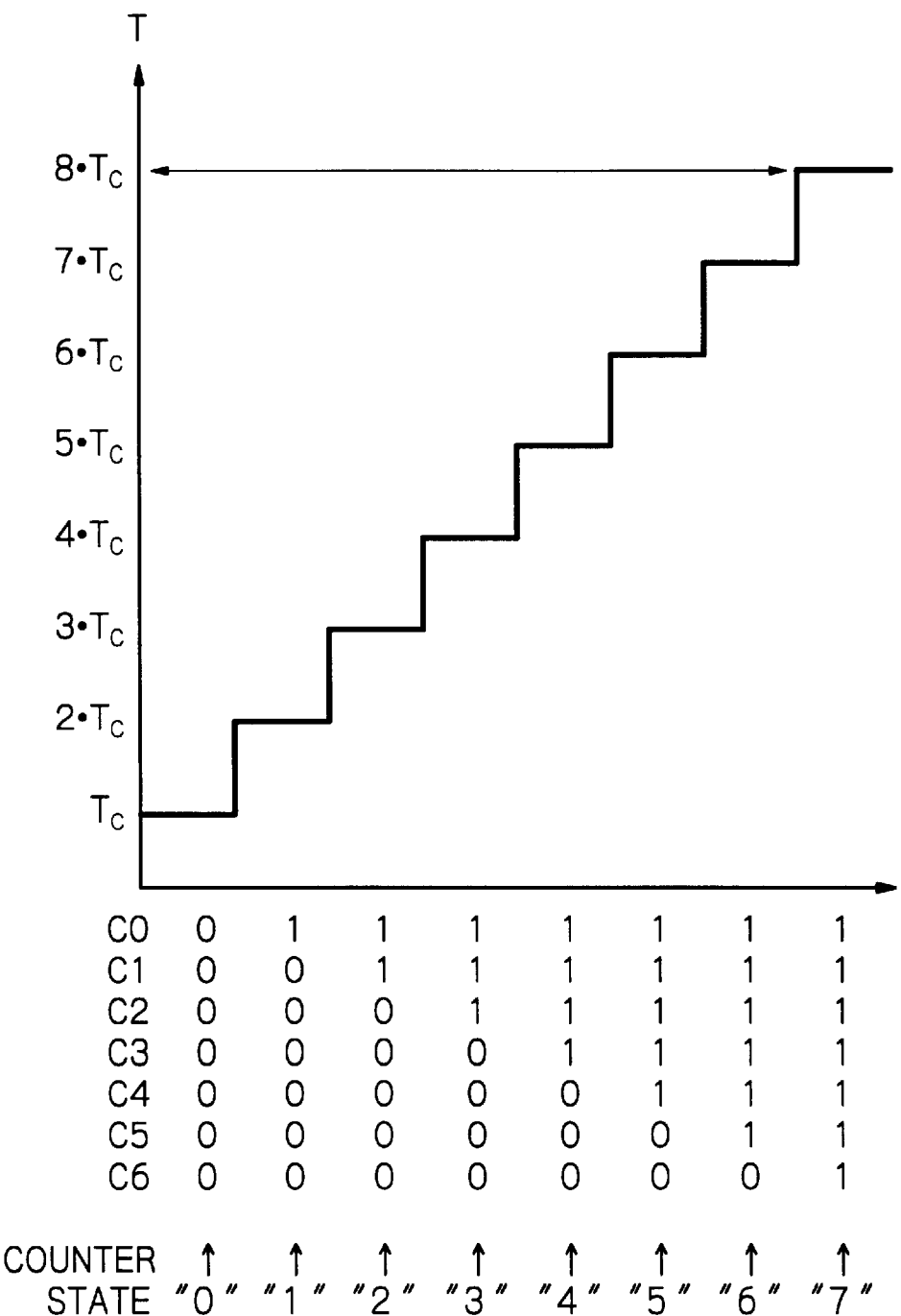
FIG. 9 is a graph showing the delay time of the coarse variable delay circuit of FIG. 7.

Thus, if the ring counter 31 has eight states "0", "1", . . . , "7" as shown in FIG. 7A, the delay time $T_1$ of the coarse variable delay circuit 11 is changed stepwise at eight values $T_c$, $2 \cdot T_c$, . . . , $8 \cdot T_c$, as shown in FIG. 9.

In FIG. 8, since the NAND circuits such as 110a and 110b are dynamic, even if a change occurs in the output signals C0, C1, . . . , C6 of the ring counter 31, the generation of a spurious pulse in the output of the coarse variable delay circuit 11 can be prevented.

Also, If the number of delay elements is increased, the maximum value of the delay time $T_1$ can be easily increased, while the minimum value of the delay time $T_1$ is $T_c$. In this case, note that the selector 1010 of FIG. 2 which is of a large scale is unnecessary.

Figure 10:
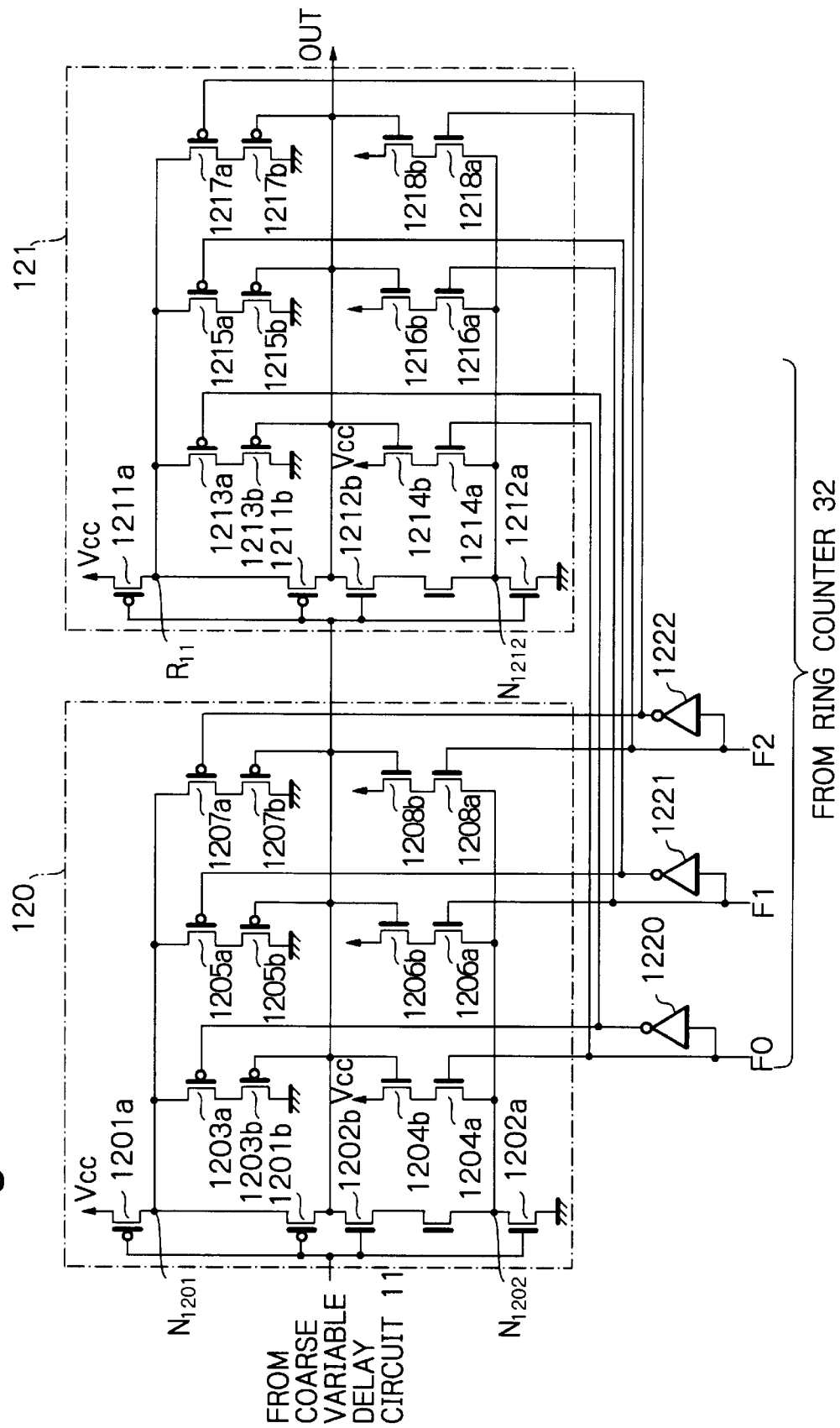
FIG. 10 is a detailed circuit diagram of the fine variable delay circuit of FIG. 6.

In FIG. 10, which is a detailed circuit diagram of the fine variable delay circuit 12 of FIG. 6, two delay elements 120 and 121 having the same configuration are connected in series. Each of the delay elements 120 and 121 are controlled via inverters 1220, 1221, and 1222 by the output signals F0, F1 and F2 of the ring counter 32 as shown in FIG. 7B.

The delay element 120 (121) includes an inverter formed by two P-channel MOS transistors 1201a and 1201b (1211a and 1211b) and two N-channel MOS transistors 1202a and 1202b (1212a and 1212b).

Also, connected between a nods $N_{1201}$ ($N_{1211}$) of the transistors 1201a and 1201b (1211a and 1211b) and a ground terminal GND are three series of two P-channel MOS transistors 1203a and 1203b, 1205a and 1205b, and 1207a and 1207b (1213a and 1213b, 1215a and 1215b, and 1217a and 1217b). Similarly, connected between a node $N_{1202}$ ($N_{1212}$) of the transistors 1202a and 1202b (1212a and 1212b) and a power supply terminal $V_{cc}$ are three series of two N-channel MOS transistors 1204a and 1204b, 1206a and 1206b, and 1208a and 1208b (1214a and 1214b, 1216a and 1216b, and 1218a and 1218b).

The gates of the transistors 1203b, 1204b, 1205b, 1206b. 1207b and 1208b (1213b, 1214b, 1215b, 1216b, 1217b and 1218b) are connected to the output of the inverter (izola, 1201b. 1202a, 1202b, 1211a, 1211b. 1212a, 1212b). Also, the gates of the transistors 1203a, 1205a and 1207a (1213a, 1215a and 1217a) are controlled by the inverted signals of the control signals F0. F1, and F2, respectively. Further, the gates of the transistors 1204a. 1206a, and 1208a (1214a, 1216a and 1218a) are controlled by the control signals F0, F1 and F2, respectively.

The transistors 1203a, 1203b, . . . , 1208a, 1208b are operated to increase the logic threshold voltages of the inverter (1201a, 1201b, 1202a, 1202b), and the transistors 1213a, 1213b, 1218a. 1218b are operated to increase the logic threshold voltages of the inverter (1211a, 1211b, 1212a, 1212b).

If the gate width of the transistors 1203a and 1203b (1213a and 1213b) is $W_{P1}$, the gate width of the transistors 1205a and 1205b (1215a and 1215b) is $W_{P2}$, and the gate width of the transistors 1207a and 1207b (1217a and 1217b) is $W_{P3}$, the following condition is satisfied:

$$W_{P1} < W_{P2} < W_{P3}$$

Similarly, if the gate width of the transistors 1204a and 1204b (1214a and 1214b) is $W_{n1}$, the gate width of the transistors 1206a and 1206b (1216a and 1216b) is $W_{n2}$, and the gate width of the transistors 1208a and 1208b (1218a and 1218b) is $W_{n3}$, the following condition is satisfied:

$$W_{n1} < W_{n2} < W_{n3}$$

Figure 11:
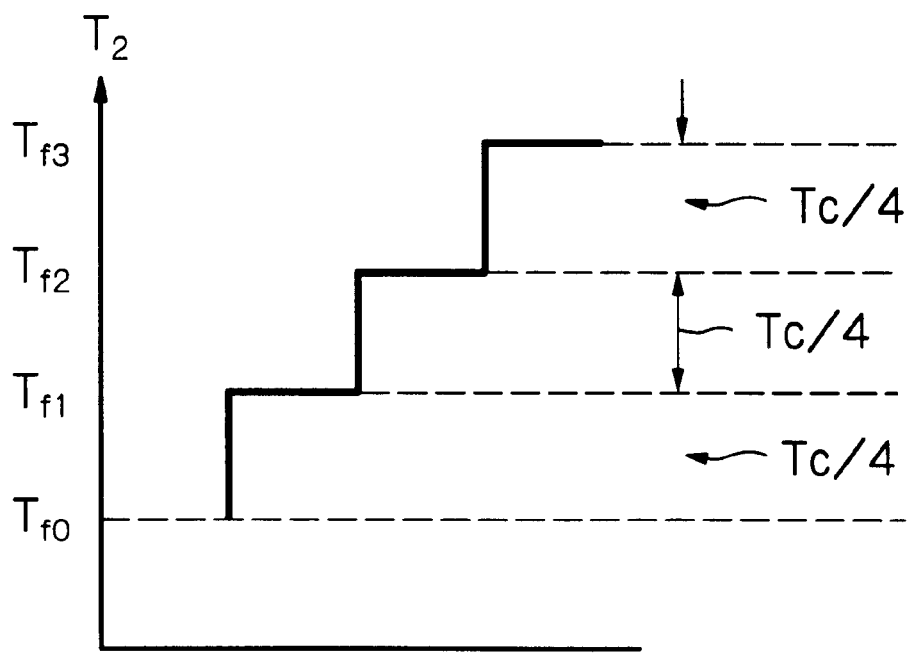
FIG. 11 is a graph showing the delay time of the fine variable delay circuit of FIG. 10.

Under the above-mentioned two conditions, if the ring counter 32 has four states "0", "1", "2" and "3" as shown in FIG. 7B, the delay time $T_2$ of the fine variable delay circuit 12 stepwise at four values $T_{f0}$, $T_{f1}$, $T_{f2}$ and $T_{f3}$ as shown in FIG. 11. In this case, if the gate widths $W_{P1}$, $W_{P2}$, $W_{P3}$, $W_{n1}$, $W_{n2}$ and $W_{n3}$ are suitably adjusted, the following conditions can be satisfied:

$$T_{f1} - T_{f0} = T_c/4$$

$$T_{f2} - T_{f1} = T_c/4$$

$$T_{f3} - T_{f2} = T_c/4$$

Figure 12:
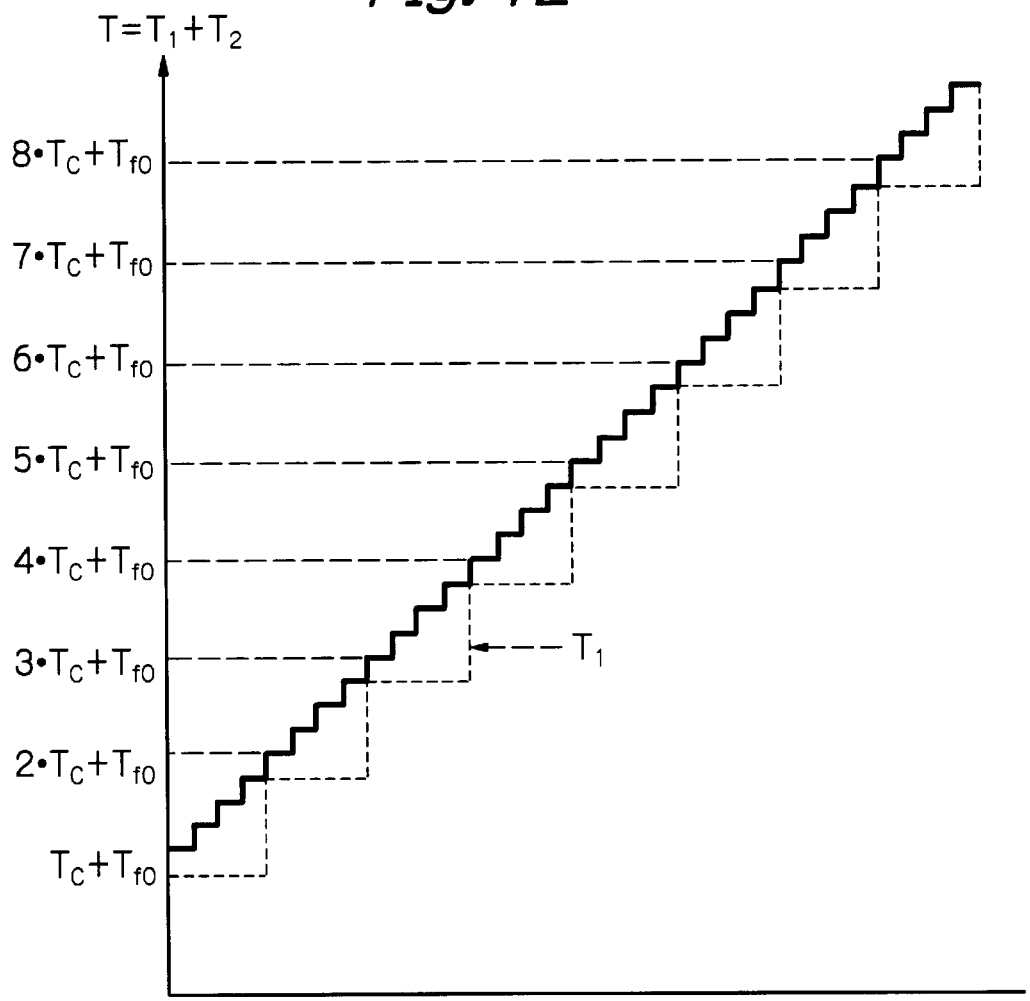
FIG. 12 is a graph showing the delay time of the variable delay circuit of FIG. 6.

The delay time T of the variable delay circuit z can be obtained by combining the graphs of FIGS. 9 and 11 into a graph as shown in FIG. 12.

For example, assume the (C0, C1, C2, C3, C4, C5, C6)=(0, 0, 0, 0, 0, 0, 0). In this case, if (F0, F1, F2)=(0, 0, 0), $$T = T_1 + T_2 = T_c + T_{f0}$$

Also, if (F0, F1, F2)=(1, 0, 0), $$T = T_1 + T_2 = T_c + T_{f0} + T_c/4$$

Further, if (F0, F1, F2)=(0, 1, 0), $$T = T_1 + T_2 = T_c + T_{f0} + T_c/2$$

Additionally, if (F0, F1, P2) =(0, 0, 1).

$$T = T_1 + T_2 = T_c + T_{f0} + 3 \cdot T_c/4$$

Next, assume that (C0, C1, C2, C3, C4, C5, C6)=(1, 0, 0, 0, 0, 0, 0)

In this case, if (F0, F1, F2)=(0, 0, 0), $$T = T_1 + T_2 = 2 \cdot T_c + T_{f0}$$

Also, if (F0, F1, F2)=(1, 0, 0).

$$T = T_1 + T_2 = 2 \cdot T_c + T_{f0} + T_c/4$$

Further, if (F0, F1, F2)=(0, 1, 0), $$T = T_1 + T_2 = 2 \cdot T_c + 3 \cdot T_c/4$$

Additionally, if (F0, F1, F2)=(0, 0, 1), $$T = T_1 + T_2 = 2 \cdot T_c + T_{f0} + 3 \cdot T_c/4$$

Next, assume that (C0, C1, C2, C3, C4, C5, C6)=(1, 1, 0, 0, 0, 0, 0)
In this case, if (F0, F1, F2)=(0, 0, 0), $$T=T_1+T_2=3\cdot T_c+T_{f0}$$

Also, if (F0, F1, F2)=(1, 0, 0), $$T=T_1+T_2=3\cdot T_c+T_{f0}+T_c/4$$

Further, if (F0, F1, F2)=(0, 1, 0), $$T=T_1+T_2=3\cdot T_c+T_{f0}+T_c/2$$

Additionally, if (F0, F1, F2)=(0, 0, 1).

$$T=T_1+T_2=3\cdot T_c+T_{f0}+3\cdot T_c/4$$

C5, C6)=(1, 1, 1, 0, 0, 0, 0)
In this case, if (F0, F1, F2)=(0, 0, 0).

$$T=T_1+T_2=4\cdot T_c+T_{f0}$$

Also, if (P0, F1, P2)=(1, 0, 0), $$T=T_1+T_2=4\cdot T_c+T_{f0}+T_c/4$$

Further, if (F0, F1, F2)=(0, 1, 0), $$T=T_1+T_2=4\cdot T_c+T_{f0}+T_c/2$$

Additionally, if (F0, F1, F2)=(0, 0, 1), $$T=T_1+T_2=4\cdot T_c+T_{f0}+3\cdot T_c/4$$

Next, assume that (C0, C1, C2, C3, C4, C5, C6)=(1, 1, 1, 1, 0, 0, 0)
In this case, if (F0, F1, F2)=(0, 0, 0), $$T=T_1+T_2=5\cdot T_c+T_{f0}$$

Also, if (F0, F1, F2)=(1, 0, 0), $$T=T_1+T_2=5\cdot T_c+T_{f0}+T_c/4$$

Further, if (F0, F1, F2)=(0, 1, 0), $$T=T_1+T_2=5\cdot T_c+T_{f0}+T_c/2$$

Additionally, If (F0, F1, F2)–(0, 0, 1), $$T=T_1+T_2=5\cdot T_c+T_{f0}+3\cdot T_c/4$$

Next, assume that (C0, C1, C2, C3, C4, C5, C6)=(1, 1, 1, 1, 1, 0, 0)
In this case, if (F0, F1, F2)=(0, 0, 0), $$T=T_1+T_2=6\cdot T_c+T_{f0}$$

Also, if (F0, F1, F2)=(1, 0, 0), $$T=T_1+T_2=6\cdot T_c+T_{f0}+T_c/4$$

Further, if (F0, F1, F2)=(0, 1, 0), $$T=T_1+T_2=6\cdot T_c+T_{f0}+T_c/2$$

Additionally, if (F0, F1, F2)=(0, 0, 1), $$T=T_1+T_2=6\cdot T_c+T_{f0}+3\cdot T_c/4$$

Next, assume that (C0, C1, C2, C3, C4, C5, C6)=(1, 1, 1, 1, 1, 1, 0)
In this case, if (F0, F1, F2)β(0, 0, 0), $$T=T_1+T_2=7\cdot T_c+T_{f0}$$

Also, if (F0, F1, F2)=(1, 0, 0), $$T=T_1+T_2=7\cdot T_c+T_{f0}+T_c/4$$

Further, if (F0, F1, F2)=(0, 1, 0), $$T=T_c+T_2=7\cdot T_c+T_{f0}+T_c/2$$

Additionally, if (F0, F1, F2)=(0, 0, 1), $$T=T_1+T_2=7\cdot T_c+T_{f0}+3\cdot T_c/4$$

Finally, assume that (C0, C1, C2, C3, C4, C5, C6)=(1, 1, 1, 1, 1, 1, 1)
In this case, if (F0, F1, F2)=(0, 0, 0), $$T=T_1+T_2=8\cdot T_c+T_{f0}$$

Also, if (F0, F1, F2)=(1, 0, 0), $$T=T_1+T_2=8\cdot T_c+T_{f0}+T_c/4$$

Further, If (F0, F1, F2)=(0, 1, 0), $$T=T_1+T_2=8\cdot T_c+T_{f0}+T_c/2$$

Additionally, If (P0, F1, F2)=(0, 0 1), $$T=T_1+T_2=8\cdot T_c+T_{f0}+3\cdot T_c/4$$

Figure 13:
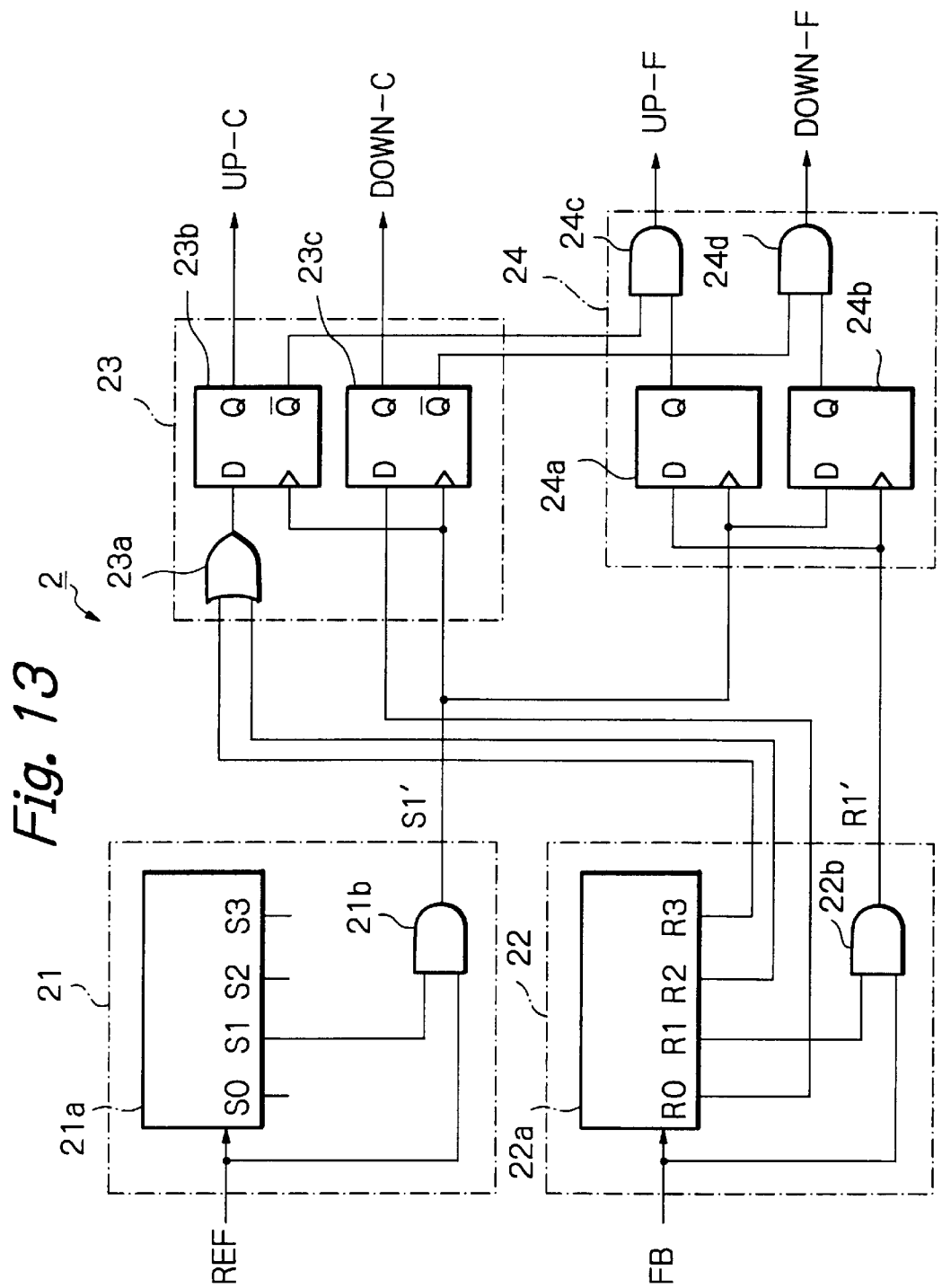
FIG. 13 is a detailed circuit diagram of the phase comparator of FIG. 6.
Figure 14:
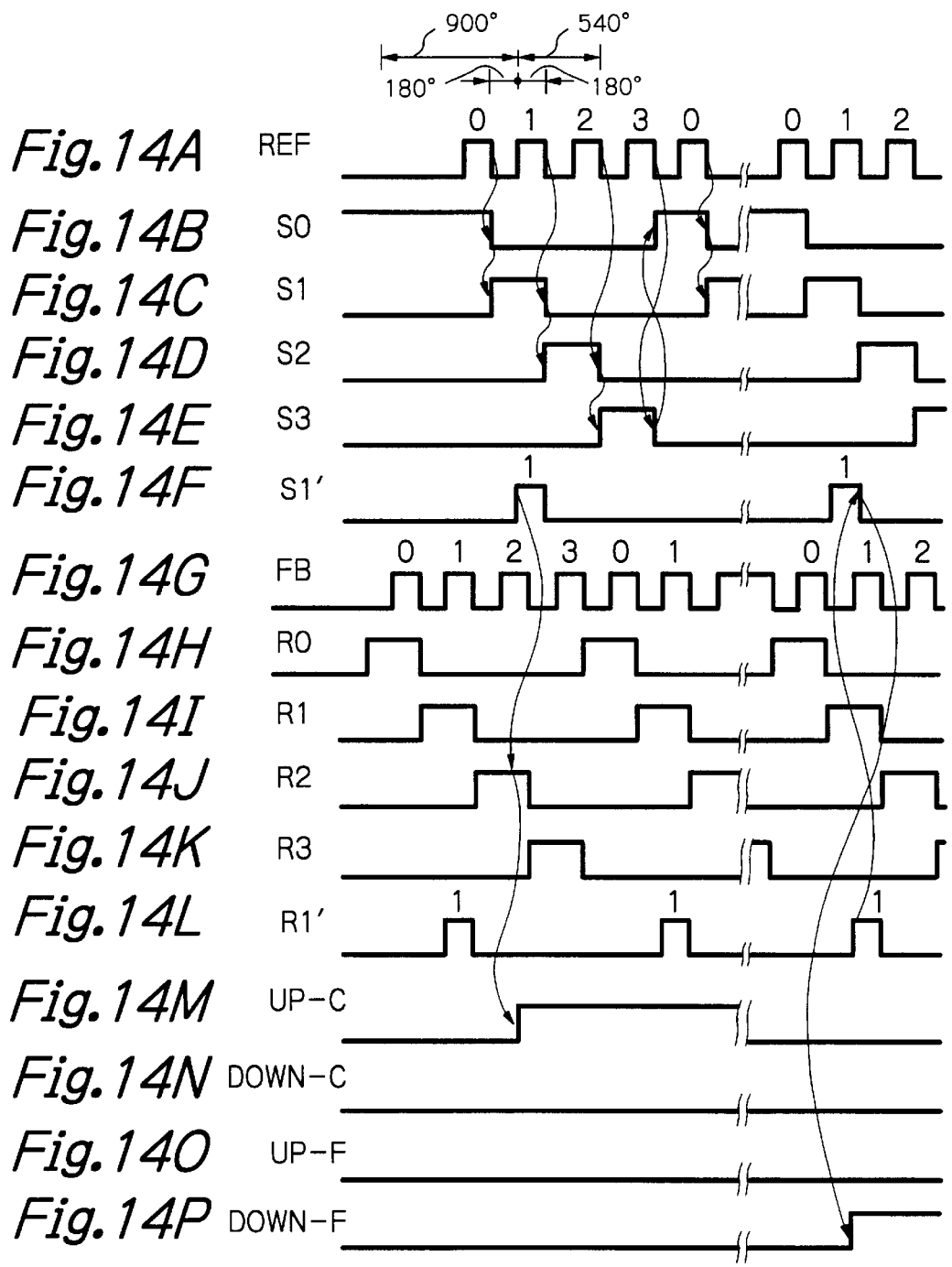
FIGS. 14A through 14P are timing diagrams showing the operation of the phase comparator of FIG. 13.

FIG. 13 is a detailed block circuit diagram of the phase comparator 2 of FIG. 6, and FIGS. 14A through 14P are timing diagrams showing the operation the phase comparator 2 of FIG. 13.

The pulse selection circuit 21 is formed by a 4-ary ring counter 21a with a decoding function and an AND circuit 21b. That is, when the ring counter 21a receives the reference signal REF as shown in FIG. 14A, the ring counter 21a numbers each pulse of the reference signal REF at its rising edge. As a result, the outputs S0, S1, S2 and S3 of the ring counter 21a corresponding to the numbers "0", "1", "2" and "3", respectively are changed as shown in FIGS. 14B, 14C, 14D and 14E, respectively. Also, since the AND circuit 21b receives the reference signal REF and the output S1 of the ring counter 21a, the AND circuit 21b selects only the pulses of the reference signal REF having the number "1", so that the AND circuit 21b generates a signal S1' as shown in FIG. 14F.

Also, the pulse selection circuit 22 is formed by a 4-ary ring counter 22a with a decoding function and an AND circuit 22b. That is, when the ring counter 22a receives the feedback signal FB as shown in FIG. 14G, the ring counter 22a numbers each pulse of the feedback signal FB at its rising edge. As a result, the outputs R0, R1, R2 and R3 of the ring counter 22a corresponding to the numbers "0", "1", "2", and "3", respectively are changed as shown in FIGS. 14H, 14I, 14J and 14K, respectively. Also, since the AND circuit 22b receives the feedback signal FB and the output R1 of the ring counter 22a, the AND circuit 22b selects only the pulses of the feedback signal FB having the number "1", so that the AND circuit 22b generates a signal R1' as shown in FIG. 14L.

The signal S1' of the AND circuit 21b and the output signals R0, R2 and R3 of the ring counter 22a are supplied to the large phase comparator 23 for determining whether the phase of the feedback signal FB advances by 180° or more as compared with the phase of the reference signal REP and determining whether the phase of the feedback signal FB retards by 180° or more as compared with the phase of the reference signal REF. The large phase comparator 23 is formed by an OR circuit 23a and two D-type flip-flops 23b and 23c. The D-type flip-flop 23b is clocked by the rising edge of the signal S1' to fetch the output signal R2 or R3 of the counter 22a. That is, if the difference in phase between the feedback signal FB and the reference signal REF is 180°~900°, the output Q of the D-type flip-flop 23b is "1", i.e. the control signal UP-C is "1". On the other hand, the D-type flip-flop 23c is clocked by the rising edge of the signal S1' to fetch the output signal RO of the counter 22a. That is, if the difference in phase between the feedback signal FB and the reference signal REF is −180°~540°, the output Q of the D-type flip-flop 23c is "1" i.e. the control signal DOWN-C is "1". Note that the control signals UP-C and DOWN-C are shown in FIGS. 14M and 14N.

When the control signal UP-C is "1", the content of the ring counter 31 is increased to increase the delay time $T_1$ of the coarse variable delay circuit 11. On the other hand, when the control signal DOWN-C is "1", the content of the ring counter 31 is decreased to decrease the delay time $T_1$ of the coarse variable delay circuit 11.

The signal S1' of the AND circuit 21b and the signal R1' of the AND circuit 22b are supplied to the small phase comparator 24 for determining whether the phase of the feedback signal FB advances by 180° or less as compared with the phase of the reference signal REF and determining whether the phase of the feedback signal PB retards by 180° or less as compared with the phase of the reference signal REP. The small phase comparator 24 is formed by two D-type flip-flop 24b and 24c and two AND circuits 24c and 24b. The D-type flip-flop 24a is clocked by the rising edge of the signal S1' to fetch the signal R1'. That is, if the difference in phase between the feedback signal FB and the reference signal REF is 0°~180°, the output Q of the D-type flip-flop 24a is "1", so that the control signal UP-1 is "1", since the output $\overline{Q}$ of the D-type flip-flop 23b is "1". On the other hand, the D-type flip-flop 24b is clocked by the rising edge of the signal R1' to fetch the output signal S1'. That is, if the difference in phase between the feedback signal FB and the reference signal REF is −180°~0° the output Q of the D-type flip-flop 24b is "1", so that the control signal DOWN-F is 1, since the output $\overline{Q}$ of the D-type flip-flop 23c is "1". Note that the control signals UP-E and DOWN-F are shown in FIGS. 14O and 14P.

When the control signal UP-F is "1", the content of the ring counter 32 is increased to increase the delay time 11 of the fine variable delay circuit 12. On the other hand, when the control signal DOWN-F is "1", the content of the ring counter 32 is decreased to decrease the delay time $T_2$ of the fine variable delay circuit 12.

Figure 15:
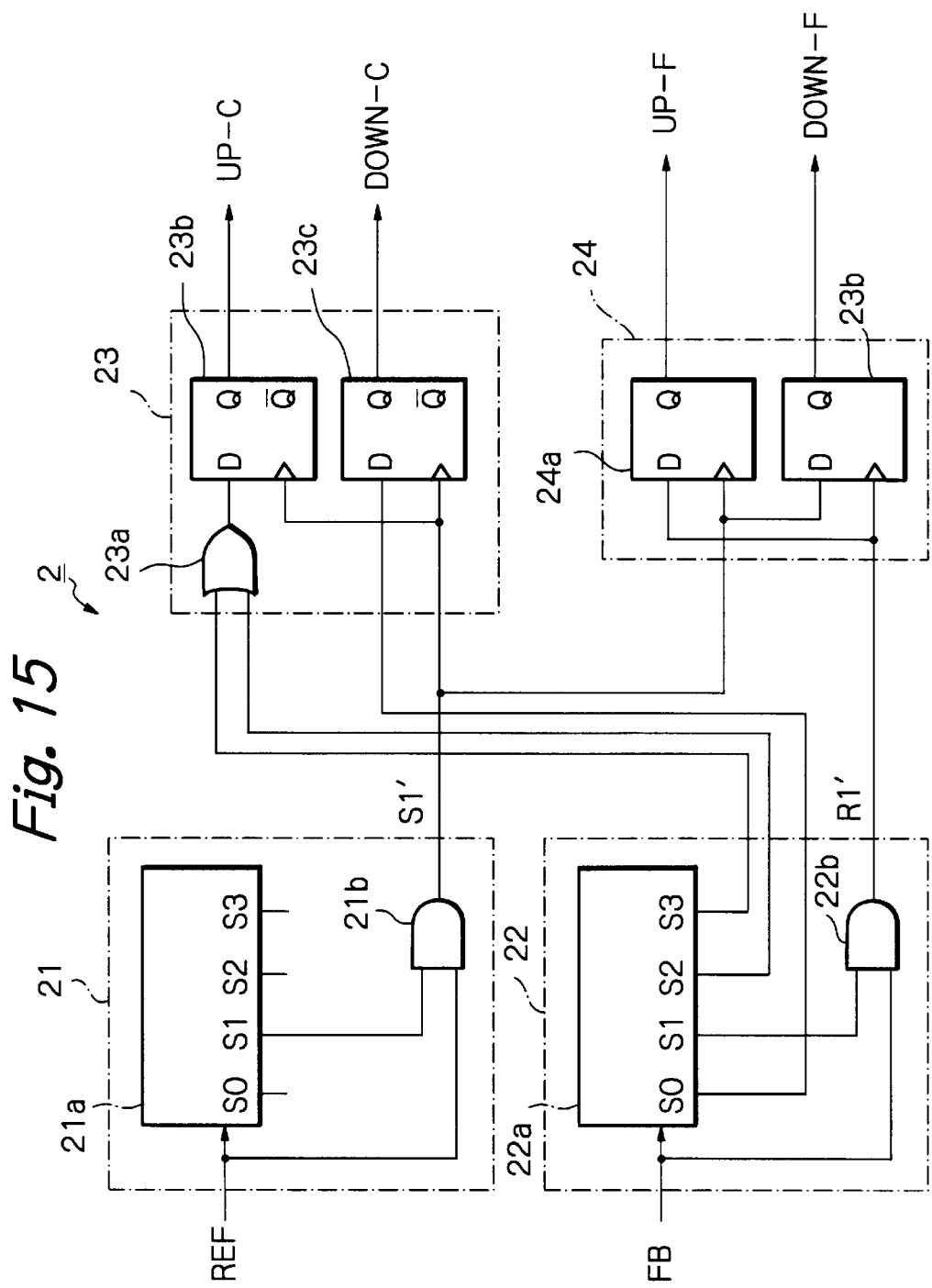
FIG. 15 is a circuit diagram illustrating a modification of the phase comparator of FIG. 13.

In FIG. 13, the AND circuit 24c and 24d are provided, so that if the large phase comparator 23 is substantially operated, the small phase comparator 24 is not substantially operated. That is, if the control signal UP-C is "1", the control signal UP-F is always "0", and if the control signal DOWN-C is "0", the control signal DOWN-F is always "0". In other words, only one of the phase comparators 23 and 24 is substantially operated, to stabilize the operation of the variable delay circuit 1. However, as illustrated in FIG. 15, the AND circuits 24c and 24d can be omitted.

Figure 16:
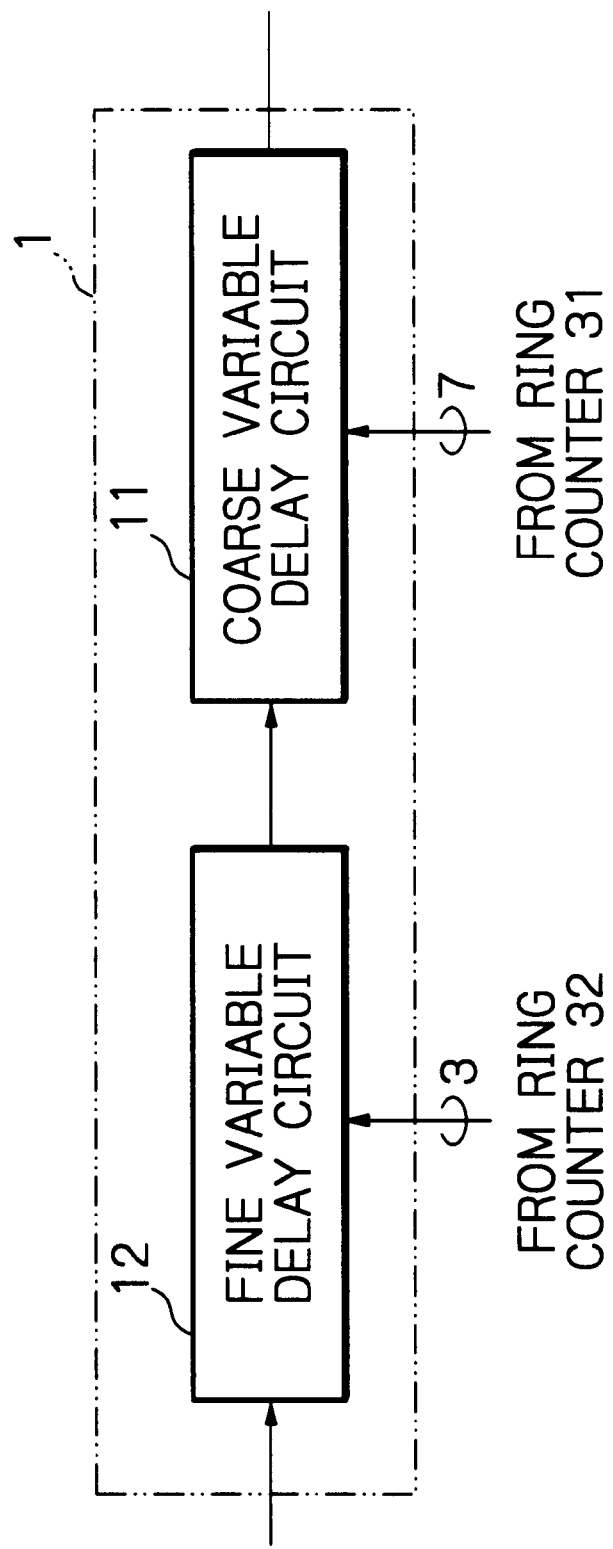
FIG. 16 is a block circuit diagram illustrating of the variable delay circuit of FIG. 6.

Also, in FIG. 6, although the variable delay circuit 1 is a series of the coarse variable delay circuit 11 and the fine variable delay circuit 12, the variable delay circuit 1 can be a series of the fine variable delay circuit 12 and the coarse variable delay circuit 11 as illustrated in FIG. 16.

Further, in FIG. 6, although the feedback signal FB is obtained directly by the output signal OUT, the feedback signal FB is obtained indirectly by the output signal OUT. For example, a frequency divider is provided between an output terminal for the output signal OUT and a terminal for the feedback signal FB.

As explained hereinabove, according to the present invention, when the difference in phase between the feedback signal and the reference signal is relatively large, the large phase comparator is operated to remarkably change the delay time, and when the above-mentioned difference is relatively small, the small phase comparator is operated to gradually change the delay time. As a result, the decrease of jitter as well as the decrease of the locking time can be both obtained. Additionally, due to the large phase comparator, even if the difference in phase is large, the feedback signal can be correctly locked to the reference signal.

What is claimed is:

1. A digital delay-locked loop circuit, comprising:

a variable delay circuit for delaying an input signal and generating an output signal, said variable delay circuit including a first variable delay circuit for at least indirectly delaying said input signal with a first delay time changed at first intervals and a second variable delay circuit, connected in series to said first variable delay circuit, for at least indirectly delaying said input signal with a second delay time changed at second intervals smaller than said first intervals;

a phase comparator for comparing a phase of a feedback signal derived from said output signal with a phase of a reference signal; and a counter circuit, connected between said phase comparator and said first and second variable delay circuits, for controlling said first and second delay times in accordance with a difference in phase between said feedback signal and said reference signal so that said difference in phase is brought close to zero, wherein said phase comparator includes:
  a first phase comparator for comparing the phase of said feedback signal with the phase of said reference signal when said difference in phase is larger than a predetermined value; and
  a second phase comparator for comparing the phase of said feedback signal with the phase of said reference signal when said difference in phase is not larger than said predetermined value, wherein said counter circuit comprises:
  a first ring counter with a decoding function, connected between said first phase comparator and said first delay circuit, for changing said first delay time in accordance with an output of said first phase comparator; and
  a second ring counter with a decoding function, connected between said second phase comparator and said second delay circuit, for changing said second delay time in accordance with an output of said second phase comparator, and wherein said phase comparator further comprises:
  a first pulse selection circuit for receiving said reference signal, numbering pulses of said reference signal with reference signal pulse numbers and generating the pulses of said reference signal having a predetermined number of said reference signal pulse numbers; and
  a second pulse selection circuit for receiving said feedback signal, numbering pulses of said feedback signal with feedback signal pulse numbers and generating the pulses of said feedback signal, including pulses of said feedback signal with said predetermined number of said feedback signal pulse numbers, said first phase comparator being connected to said first and second pulse selection circuits for comparing the pulses of said feedback signal other than the pulses of said feedback signal having said predetermined number with the pulses of said reference signal having said predetermined number to generate a first phase comparison signal, said first phase comparison signal being transmitted to said counter circuit, said second phase comparator being connected to said first and second pulse selection circuits for comparing the pulses of said feedback signal having said predetermined number with the pulses of said reference signal having said predetermined number to generate a second phase comparison signal, said second phase comparison signal being transmitted to said counter circuit.

2. The digital delay-locked loop circuit as set forth in claim 1, wherein said first phase comparator comprises:

a first D-type flip-flop for receiving the pulses of said feedback signal having numbers, larger than said predetermined number, said first D-type flip-flop being clocked by the pulses of said reference signal having said predetermined number to generate said first phase comparison signal for incrementing a content of said first ring counter; and a second D-type flip-flop for receiving the pulses of said feedback signal having numbers smaller than said predetermined number, said second D-type flip-flop being clocked by the pulses of said reference signal having said predetermined number to generate said first phase comparison signal for decrementing the content of said first ring counter, said second phase comparator comprising:

a third D-type flip-flop for receiving the pulses of said feedback signal having said predetermined number, said third D-type flip-flop being clocked by the pulses of said reference signal having said predetermined number to generate said second phase comparison signal for incrementing a content of said second ring counter; and a fourth D-type flip-flop for receiving the pulses of said reference signal having said predetermined number, said fourth D-type flip-flop being clocked by the pulses of said feedback signal having said predetermined number to generate said second phase comparison signal for decrementing the content of said second ring counter.

3. The digital delay-locked loop circuit as set forth in claim 2, wherein said second phase comparator further comprises a first AND circuit, connected to outputs of said first and third D-type flip-flops, for passing said second phase comparison signal for incrementing the content of said second ring counter in accordance with an output of said first D-type flip-flop;

a second AND circuit, connected to outputs of said second and fourth D-type flip-flops, for passing said second phase comparison signal for decrementing the content of said second ring counter in accordance with an output of said third D-type flip-flop.

4. A digital delay-locked loop circuit, comprising:

a variable delay circuit for delaying an input signal and generating an output signal, said variable delay circuit including a first variable delay circuit for at least indirectly delaying said input signal with a first delay time changed at first intervals and a second variable delay circuit, connected in series to said first variable delay circuit, for at least indirectly delaying said input signal with a second delay time changed at second intervals smaller than said first intervals;

a phase comparator for comparing a phase of a feedback signal derived from said output signal with a phase of a reference signal; and a counter circuit, connected between said phase comparator and said first and second variable delay circuits, for controlling said first and second delay times in accordance with a difference in phase between said feedback signal and said reference signal so that said difference in phase is brought close to zero, wherein said first variable delay circuit comprises a plurality of delay elements connected in series, each of said delay elements including a first dynamic NAND circuit for passing said input signal, a second dynamic NAND circuit for folding said input signal and a static NAND circuit connected to an output of said second dynamic NAND circuit and a folded output of a post stage delay element of said each of said delay elements, only one of said first and second dynamic NAND circuits being activated by said counter circuit.

5. A digital delay-locked loop circuit, comprising:

a variable delay circuit for delaying an input signal and generating an output signal, said variable delay circuit including a first variable delay circuit for at least indirectly delaying said input signal with a first delay time changed at first intervals and a second variable delay circuit, connected in series to said first variable delay circuit, for at least indirectly delaying said input signal with a second delay time changed at second intervals smaller than said first intervals;

a phase comparator for comparing a phase of a feedback signal derived from said output signal with a phase of a reference signal; and a counter circuit, connected between said phase comparator and said first and second variable delay circuits, for controlling said first and second delay times in accordance with a difference in phase between said feedback signal and said reference signal so that said difference in phase is brought close to zero, wherein said second variable delay circuit comprises two delay elements connected in series, each of said delay elements including:

an inverter formed by first and second P-channel MOS transistors connected in series to a power supply terminal and first and second N-channel MOS transistor connected in series to a ground terminal;

a plurality of pairs of third and fourth P-channel MOS transistors connected in series between a node of said first and second P-channel MOS transistors and said ground terminal, said third P-channel MOS transistors being controlled by said counter circuit, said fourth P-channel MOS transistors being controlled by a voltage at an output of said inverter; and a plurality of pairs of third and fourth N-channel MOS transistors connected in series between a node of said first and second N-channel MOS transistors and said power supply terminal, said third N-channel MOS transistors being controlled by said counter circuit, said fourth N-channel MOS transistors being controlled by a voltage at an output of said inverters.

6. The digital delay-locked loop circuit as set forth in claim 5, wherein gate widths of said third and fourth P-channel MOS transistors of one pair are different from those of another pair, gate widths of said third and fourth N-channel MOS transistors of one pair being different from those of another pair.

7. A delay-locked loop circuit, comprising:

a variable delay circuit that generates an output signal by delaying an input signal, wherein the variable delay circuit at least indirectly delays the input signal by a first variable delay time that changes at first intervals and at least indirectly delays the input signal by a second variable delay time that changes at second intervals and wherein the first variable delay time is different than the second variable delay time;

a phase comparator circuit that that compares a phase of a feedback signal derived from the output signal with a phase of a reference signal; and a control circuit that controls the first and second variable delay times in accordance with a difference between the phase of the feedback signal and the phase of the reference signal so that the difference between the phase of the feedback signal and the phase of the reference signal approaches zero, wherein the phase comparator circuit includes:

a first phase comparator circuit that compares the phase of the feedback signal with the phase of the reference signal when the difference between the phase of the feedback signal and the phase of the reference signal is larger than a predetermined value;

a second phase comparator circuit that compares the phase of the feedback signal with the phase of the reference signal when the difference between the phase of the feedback signal and the phase of the reference signal is not larger than the predetermined value, a first pulse selection circuit that receives the reference signal and counts pulses of the reference signal to produce a first counted value, wherein the first pulse selection circuit outputs a reference pulse identification signal when the first counted value equals a first particular value; and a second pulse selection circuit that receives the feedback signal and counts pulses of the feedback signal to produce a second counted value, wherein the second pulse selection circuit outputs a particular feedback pulse identification signal when the second counted value equals a second particular value and wherein the second pulse selection circuit outputs at least one additional feedback pulse identification signal when the second counted value does not equal the second particular value, wherein the first phase comparator circuit makes a first comparison of the pulses of the feedback signal with the pulses of the reference signal based on the reference pulse identification signal and the at least one additional feedback pulse identification signal, and wherein the first phase comparator circuit generates a first phase comparison signal corresponding to the first comparison, wherein the second phase comparator circuit makes a second comparison of the pulses of the feedback signal with the pulses of the reference signal based on the reference pulse identification signal and the particular feedback pulse identification signal, and wherein the second phase comparator circuit generates a second phase comparison signal corresponding to the second comparison, and wherein the control circuit controls the first variable delay time in accordance with the first phase comparison signal and controls the second variable delay time in accordance with the second phase comparison signal.

8. The delay-locked loop circuit as set forth in claim 7, wherein the first particular value equals the second particular value.

9. The delay-locked loop circuit as set forth in claim 7, wherein the at least one additional feedback pulse identification signal comprises a first additional feedback pulse identification signal and a second additional feedback pulse identification signal, wherein the first additional feedback pulse identification signal is output by the second pulse selection circuit when the second counted value is greater than the second particular value, and wherein the second additional feedback pulse identification signal is output by the second pulse selection circuit when the second counted value is less than the second particular value, wherein the first phase comparison signal comprises a first phase control signal and a second phase control signal, wherein the second phase comparison signal comprises a third phase control signal and a fourth phase control signal, wherein the first phase comparator circuit comprises:

a first flip-flop that is least indirectly inputs the first additional feedback pulse identification signal, is at least indirectly clocked by the reference pulse identification signal, and at least indirectly outputs the first phase control signal; and a second flip-flop that is least indirectly inputs the second additional feedback pulse identification signal, is at least indirectly clocked by the reference pulse identification signal, and at least indirectly outputs the second phase control signal, and wherein the second phase comparator circuit comprises:

a third flip-flop that at least indirectly inputs the particular feedback pulse identification signal, is clocked by the reference pulse identification signal, and at least indirectly outputs the third phase control signal; and a fourth flip-flop that at least indirectly inputs the reference pulse identification signal, is clocked by the particular feedback pulse identification signal, and at least indirectly outputs the fourth phase control signal.

10. The delay-locked loop circuit as set forth in claim 9, wherein the second phase comparator circuit further comprises:

a first AND circuit that inputs a complement of the first phase control signal and the third phase control signal and masks an output of the third phase control signal based on the complement of the first phase control signal; and a second AND circuit, that inputs a complement of the second phase control signal and the fourth phase control signal and masks a output of the fourth phase control signal based on the complement of the second phase control signal.

11. A delay-locked loop circuit, comprising:

a variable delay circuit that generates an output signal by delaying an input signal, wherein the variable delay circuit at least indirectly delays the input signal by a first variable delay time that changes at first intervals and at least indirectly delays the input signal by a second variable delay time that changes at second intervals and wherein the first variable delay time is different than the second variable delay time;

a phase comparator circuit that that compares a phase of a feedback signal derived from the output signal with a phase of a reference signal; and a control circuit that controls the first and second variable delay times in accordance with a difference between the phase of the feedback signal and the phase of the reference signal so that the difference between the phase of the feedback signal and the phase of the reference signal approaches zero, wherein the variable delay circuit comprises:
  a first variable delay circuit that delays the input signal by the first variable delay time; and
  a second variable delay circuit that delays the input signal by a second variable delay time, wherein the first and second variable delay circuits are connected in series, wherein the first variable delay circuit comprises:
  a first delay element that comprises:
    a first primary dynamic NAND circuit that has a first input coupled to receive the input signal and a second input coupled to receive a first control signal from the control circuit;
    a second primary dynamic NAND circuit that has a first input operably coupled to receive the input signal and a second input operably coupled to receive a complement of the first control signal; and
    a first static NAND circuit that has a first input operably coupled to an output of the second primary dynamic NAND circuit and that outputs a delayed input signal; and
  a second delay element that comprises:
    a first secondary dynamic NAND circuit that has a first input operably coupled to an output of the first primary dynamic NAND circuit and a second input operably coupled to receive a second control signal from the control circuit;
    a second secondary dynamic NAND circuit that has a first input operably coupled to the output of the first primary dynamic NAND circuit and a second input operably coupled to receive a complement of the second control signal; and
    a second static NAND circuit that has a first input operably coupled to the output of the second secondary dynamic NAND circuit and an output operably coupled to a second input of the first static NAND circuit.

12. The delay-locked loop circuit as set forth in claim 11, wherein the first variable delay circuit further comprises:
  a final delay element that comprises:
    a first inverting circuit that has an input operably coupled to the output of the second primary dynamic NAND circuit; and
    a second inverting circuit that has an input operably coupled to an output of the first inverting circuit and has an output that is operably coupled to a second input of the second static NAND circuit.

13. A delay-locked loop circuit, comprising:
  a variable delay circuit that generates an output signal by delaying an input signal, wherein the variable delay circuit at least indirectly delays the input signal by a first variable delay time that changes at first intervals and at least indirectly delays the input signal by a second variable delay time that changes at second intervals and wherein the first variable delay time is different than the second variable delay time;

a phase comparator circuit that that compares a phase of a feedback signal derived from the output signal with a phase of a reference signal; and a control circuit that controls the first and second variable delay times in accordance with a difference between the phase of the feedback signal and the phase of the reference signal so that the difference between the phase of the feedback signal and the phase of the reference signal approaches zero, wherein the variable delay circuit comprises:
  a first variable delay circuit that delays the input signal by the first variable delay time; and
  a second variable delay circuit that delays the input signal by a second variable delay time, wherein the first and second variable delay circuits are connected in series, wherein the second variable delay circuit comprises:
  a first delay element that comprises:
    an first inverter formed by first and second P-channel MOS transistors connected in series to a power supply terminal and first and second N-channel MOS transistors connected in series to a ground terminal;
    third and fourth P-channel MOS transistors connected in series between a node of the first and second P-channel MOS transistors and the ground terminal, wherein the third P-channel MOS transistor is activated by a first control signal of the control circuit and wherein the fourth P-channel MOS transistors is activated by a voltage output from the first inverter; and
    third and fourth N-channel MOS transistors connected in series between a node of the first and second N-channel MOS transistors and the power supply terminal, wherein the third N-channel MOS transistors is controlled by a complement of the first control signal and wherein the fourth N-channel MOS transistors is controlled by the voltage output from the inverter.

14. The delay-locked loop circuit as set forth in claim 13, wherein the second variable delay circuit comprises:
  a second delay element that comprises:
    a second inverter formed by fifth and sixth P-channel MOS transistors connected in series to the power supply terminal and fifth and sixth N-channel MOS transistor connected in series to the ground terminal;
    seventh and eighth P-channel MOS transistors connected in series between a node of the fifth and sixth P-channel MOS transistors and the ground terminal, wherein the seventh P-channel MOS transistor is activated by the first control signal of the control circuit and wherein the eighth P-channel MOS transistor is activated by a voltage output from the second inverter; and
    seventh and eight N-channel MOS transistors connected in series between a node of the fifth and sixth N-channel MOS transistors and the power supply terminal, wherein the seventh N-channel MOS transistor is controlled by the complement of the first control signal and wherein the eight N-channel MOS transistors is controlled by the voltage output from the second inverter.

15. The delay-locked loop circuit as set forth in claim 13, wherein the first delay element comprises:
  fifth and sixth P-channel MOS transistors connected in series between the node of the first and second P-channel MOS transistors and the ground terminal, wherein the fifth P-channel MOS transistor is activated by a second control signal of the control circuit and wherein the sixth P-channel MOS transistors is activated by the voltage output from the first inverter; and
  seventh and eighth N-channel MOS transistors connected in series between the node of the first and second N-channel MOS transistors and the power supply terminal, wherein the seventh N-channel MOS transistors is controlled by a complement of the second control signal and wherein the eight N-channel MOS transistor is controlled by the voltage output from the first inverter.

16. The digital delay-locked circuit as set forth in claim 1, wherein when said first phase comparator generates said output, said second phase comparator is deactivated.

17. The delay-locked loop circuit as set forth in claim 7, wherein the first variable delay time is larger than the second variable delay time.

18. The delay-locked loop circuit as set forth in claim 7, wherein the variable delay circuit comprises:
  a first variable delay circuit that delays the input signal by the first variable delay time; and
  a second variable delay circuit that delays the input signal by a second variable delay time, wherein the first and second variable delay circuits are connected in series.

19. The delay-locked loop circuit as set forth in claim 18, wherein the first variable delay circuit receives the input signal and outputs a first delayed signal,
  wherein the second variable delay circuit receives at least a derivative of the first delayed signal and outputs a second delayed signal, and
  wherein the output signal is at least a derivative of the second delayed signal.

20. The delay-locked loop circuit as set forth in claim 7, wherein the control circuit includes:
  a first ring counter circuit, connected between the first phase comparator circuit and the variable delay circuit, wherein the first ring counter circuit changes the first variable delay time in accordance with the first phase comparison signal of the first phase comparator circuit; and
  a second ring counter circuit, connected between the second phase comparator circuit and the variable delay circuit, wherein the second ring counter circuit changes the second variable delay time in accordance with the second phase comparison signal of the second phase comparator circuit.

21. The delay-locked loop circuit as set forth in claim 20, wherein the variable delay circuit comprises:
  a first variable delay circuit that delays the input signal by the first variable delay time, wherein the first ring counter circuit changes the first variable delay time of the first variable delay circuit in accordance with the first phase comparison signal of the first phase comparator circuit; and
  a second variable delay circuit that delays the input signal by a second variable delay time, wherein the second ring counter circuit changes the second variable delay time of the second variable delay circuit in accordance with the second phase comparison signal of the second phase comparator circuit.

22. A digital delay-locked loop circuit comprising:
  a variable delay circuit for delaying an input signal and generating an output signal, said variable delay circuit including a first variable delay circuit for at least indirectly delaying said input signal with a first delay time changed at first intervals and a second variable delay circuit, connected in series to said first variable delay circuit, for at least indirectly delaying said input signal with a second delay time changed at second intervals smaller than said first intervals;
  a phase comparator for comparing a phase of a feedback signal derived from said output signal with a phase of a reference signal; and
  a counter circuit, connected between said phase comparator and said first and second variable delay circuits, for controlling said first and second delay times in accordance with a difference in phase between said feedback signal and said reference signal so that said difference in phase is brought close to zero,
  wherein said phase comparator includes:
    a first phase comparator for comparing the phase of said feedback signal with the phase of said reference signal when said difference in phase is larger than a predetermined value; and
    a second phase comparator for comparing the phase of said feedback signal with the phase of said reference signal when said difference in phase is not larger than said predetermined value,
    a first pulse selection circuit for receiving said reference signal, numbering pulses of said reference signal with reference signal pulse numbers and generating the pulses of said reference signal having a predetermined number of said reference signal pulse numbers; and
    a second pulse selection circuit for receiving said feedback signal, numbering pulses of said feedback signal with feedback signal pulse numbers and generating the pulses of said feedback signal, including pulses of said feedback signal with said predetermined number of said feedback signal pulse numbers,
  wherein said first phase comparator being connected to said first and second pulse selection circuits for comparing the pulses of said feedback signal other than the pulses of said feedback signal having said predetermined number with the pulses of said reference signal having said predetermined number to generate a first phase comparison signal, and
  wherein said second phase comparator being connected to said first and second pulse selection circuits for comparing the pulses of said feedback signal having said predetermined number with the pulses of said reference signal having said predetermined number to generate a second phase comparison signal.

* * * * *

UNITED STATES PATENT AND TRADEMARK OFFICE
CERTIFICATE OF CORRECTION

PATENT NO.    : 6,346,837 B1
DATED         : February 12, 2002
INVENTOR(S)   : Atsufumi Shibayama It is certified that error appears in the above-identified patent and that said Letters Patent is hereby corrected as shown below:

Column 5,
Line 41, delete "nods" insert -- node --;
Line 54, delete "izola" insert -- 1201 a --;
Line 65, after "1213b," insert -- ..., --

Column 6,
Line 46, delete "P2" insert -- F2 --

Column 7,
Line 23, delete "PO,F1,P2)" insert -- (FO,F1,F2) --;
Line 47, after "F2)" delete "-" insert -- = --

Signed and Sealed this

Third Day of June, 2003

JAMES E. ROGAN
*Director of the United States Patent and Trademark Office*